United States Patent
Mori et al.

(10) Patent No.: US 7,462,922 B2
(45) Date of Patent: Dec. 9, 2008

(54) SEMICONDUCTOR DEVICE PROVIDED WITH TEMPERATURE DETECTION FUNCTION

(75) Inventors: Shogo Mori, Kariya (JP); Kenji Ono, Kariya (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 30 days.

(21) Appl. No.: 11/010,652

(22) Filed: Dec. 10, 2004

(65) Prior Publication Data

US 2005/0156267 A1    Jul. 21, 2005

(30) Foreign Application Priority Data

Jan. 13, 2004    (JP)    ............. 2004-005943

(51) Int. Cl.
*H01L 31/04* (2006.01)
(52) U.S. Cl. ............ 257/470; 257/146; 257/E27.016; 438/237
(58) Field of Classification Search ............. 257/146, 257/470, E27.016
See application file for complete search history.

(56) References Cited

U.S. PATENT DOCUMENTS

| | | | |
|---|---|---|---|
| 4,896,199 A * | 1/1990 | Tsuzuki et al. ............. 257/49 |
| 5,502,338 A * | 3/1996 | Suda et al. ............. 257/570 |
| 5,642,252 A * | 6/1997 | Sakamoto et al. ......... 361/93.9 |
| 6,218,889 B1 * | 4/2001 | Fujiki et al. ............ 327/427 |
| 6,291,826 B1 | 9/2001 | Kubö et al. ............ 250/370.15 |
| 6,614,633 B1 * | 9/2003 | Kohno ............ 361/56 |
| 2002/0135037 A1 * | 9/2002 | Tomomatsu ............ 257/467 |
| 2004/0051145 A1 * | 3/2004 | Nobe et al. ............ 257/355 |
| 2004/0084753 A1 * | 5/2004 | Fruth et al. ............ 257/565 |

FOREIGN PATENT DOCUMENTS

| DE | 101 03 337 | 1/2002 |
|---|---|---|
| JP | 2630242 | 4/1997 |
| JP | 2002-208677 | 7/2002 |

* cited by examiner

*Primary Examiner*—Jerome Jackson
*Assistant Examiner*—Paul A Budd
(74) *Attorney, Agent, or Firm*—Morgan & Finnegan, LLP

(57) ABSTRACT

A semiconductor device provided with a temperature detection function having a high temperature detection accuracy for improving the ESD resistance of a temperature detection diode. The semiconductor device has a semiconductor element. A temperature detection diode is used to detect the temperature of the semiconductor element and an ambient temperature of the semiconductor element. A protection diode is connected between a cathode of the temperature detection diode and a ground side of the semiconductor element when the semiconductor element is activated.

8 Claims, 4 Drawing Sheets

# SEMICONDUCTOR DEVICE PROVIDED WITH TEMPERATURE DETECTION FUNCTION

BACKGROUND OF THE INVENTION

The present invention relates to a semiconductor device, and more specifically, to a semiconductor device provided with a function for detecting the temperature of a semiconductor element or the ambient temperature of a semiconductor element.

Japanese Patent No. 2630242 describes an example of a semiconductor device that prevents breakage of a semiconductor element when the temperature of the activated semiconductor element increases to an abnormal level. The semiconductor device includes a heat sensing element in addition to the semiconductor device. When there is an abnormal increase in the temperature of the semiconductor device, the heat sensing element detects the temperature increase and generates a detection signal. The semiconductor device deactivates the semiconductor element in response to the detection signal to avoid thermal breakage.

Referring to FIG. 1, the semiconductor device includes a MOS transistor 40 and a diode 41, which functions as a heat sensing element and which is formed near the MOS transistor 40. The semiconductor device detects the ambient temperature of the diode 41 by measuring the voltage in the forward direction as forward current flows through the diode 41.

When designing a semiconductor device, electrostatic discharge (ESD) resistance must be taken into consideration. Electrostatic discharge refers to static electricity. When static electricity is applied to the terminal of the semiconductor device, surge current flows through the semiconductor device. The surge current may affect the elements of the semiconductor device in an undesirable manner.

The semiconductor device described in Japanese Patent No. 2630242 includes a protection diode 42 connected parallel to the temperature detection diode 41 in an opposite direction to increase the ESD resistance of the temperature detection diode 41. In this configuration, when electrostatic discharge is applied to an anode terminal 41a of the diode 41 (i.e., when electrostatic discharge is applied such that the potential at the anode terminal 41a becomes greater than the potential at a cathode terminal 41b), current resulting from the electrostatic discharge flows through the temperature detection diode 41. When electrostatic discharge is applied to the cathode terminal 41b of the diode 41 (i.e., when electrostatic discharge is applied such that the potential at the cathode terminal 41b becomes greater than the potential at the anode terminal 41a), current resulting from the electrostatic discharge flows through the protection diode 42. This prevents reverse voltage from being applied to the temperature detection diode 41. As a result, the ESD resistance of the temperature detection diode 41 is increased.

However, due to leakage current flowing through the protection diode 42, which is connected to the diode 41 in the opposite direction, the temperature detection accuracy is lowered.

SUMMARY OF THE INVENTION

The present invention provides a semiconductor device provided with a temperature detection function that increases the ESD resistance of the temperature detection diode and has a high temperature detection accuracy.

One aspect of the present invention is a semiconductor device provided with a semiconductor element. A temperature detection diode detects a temperature of the semiconductor element or an ambient temperature of the semiconductor element. A protection diode is connected between a cathode of the temperature detection diode and a ground side of the semiconductor element when the semiconductor element is activated.

A further aspect of the present invention is a semiconductor device a first conductive region having a first conductive characteristic. A second conductive region has a second conductive characteristic and is formed on one side of the first conductive region. A third conductive region has the first conductive characteristic and is selectively formed on one side of the second conductive region. A gate layer is formed adjacent to the second conductive region by way of a first insulation film. An electrode is connected to both second and third conductive regions. A fourth conductive region has the second conductive characteristic and is formed separately from the second conductive region on the one side of the first conductive region. A conductive layer is formed adjacent to the fourth conductive region by way of a second insulation film that covers the fourth conductive region. The conductive layer includes a fifth conductive region having one of the first and second conductive characteristics. A sixth conductive region has the other one of the first and second conductive characteristics and is formed adjacent to the fifth conductive region. The fifth conductive region and the sixth conductive region define a temperature detection diode and a protection diode. The protection diode is connected between a cathode of the temperature detection diode and the electrode.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
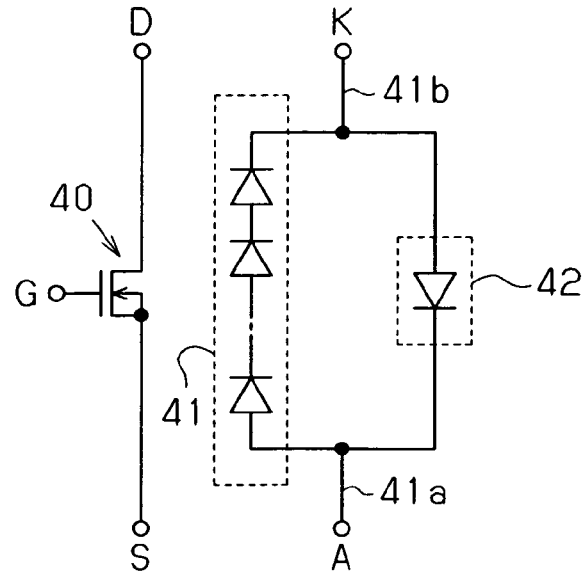
FIG. 1 is an equivalent circuit diagram of a semiconductor device in the prior art.

In the drawings, like numerals are used for like elements throughout.

Figure 2:
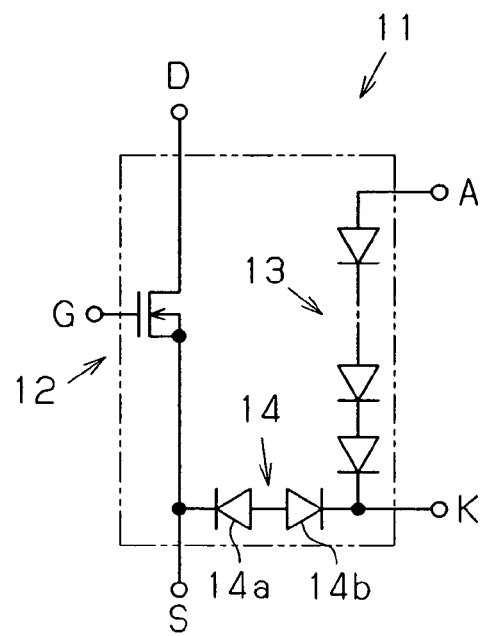
FIG. 2 is an equivalent circuit diagram of a semiconductor device according to a preferred embodiment of the present invention.
Figure 3:
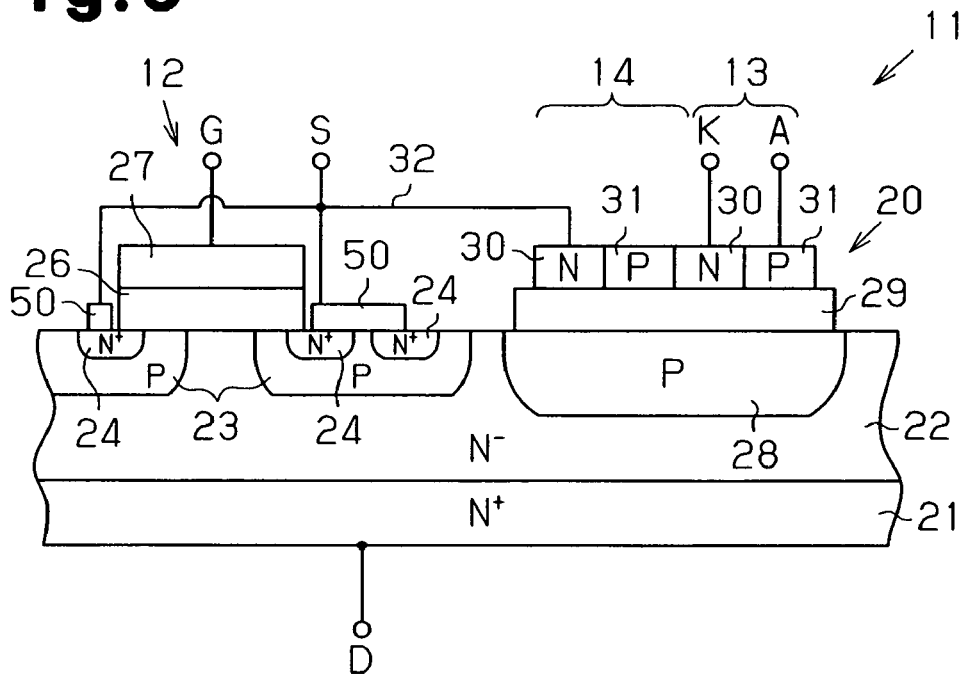
FIG. 3 is a schematic, partial cross-sectional diagram of the semiconductor device of FIG. 2.

A semiconductor device 11 according to a preferred embodiment of the present invention will now be discussed with reference to FIGS. 2 and 3. The semiconductor device 11 is provided with a temperature detection function and includes an N-channel MOSFET 12. FIG. 2 is an equivalent circuit diagram of the semiconductor device 11, and FIG. 3 is a schematic, partial cross-sectional diagram of the semiconductor device 11.

Referring to FIG. 2, the semiconductor device 11 includes the N-channel MOSFET 12 (semiconductor element), a temperature detection diode group 13, and a protection diode group 14. The protection diode group 14 is connected between the source S of the MOSFET 12 and the cathode K of the temperature detection diode group 13. When the MOSFET 12 is activated, either one of the source S or drain D functions as the ground side of the MOSFET 12. Thus, the protection diode group 14 is connected between the cathode K of the temperature detection diode group 13 and a ground side when the MOSFET 12 is activated.

The MOSFET 12 is a power MOSFET and controls the main current (current flowing from the drain D to the source S) in accordance with a signal provided to its gate G.

The temperature detection diode group 13 includes an n number (n is a natural number) of series-connected diodes. The protection diode group 14 includes two diodes 14a and 14b, which are series-connected in opposite directions. In the preferred embodiment, the anode of the diode 14a is connected to the anode of the diode 14b. The cathode of the diode 14a is connected to the source S of the MOSFET 12. The cathode of the diode 14b is connected to the cathode K of the temperature detection diode group 13.

Referring to FIG. 3, the semiconductor device 11 includes a semiconductor substrate 21, which is formed from an N⁺-type silicon. An N⁻-type epitaxial layer 22, which defines a drain region, is formed on the surface of the semiconductor substrate 21 (upper surface as viewed in FIG. 3). P-type channel regions 23 are formed in the surface of the epitaxial layer 22 opposite to the surface contacting the semiconductor substrate 21 (upper surface as viewed in FIG. 3). Source regions 24 are formed in the surface of the channel regions 23 (upper surface as viewed in FIG. 3). A gate oxidization film 26 is formed on the surface of the channel regions 23 so as to cover part of adjacent source regions 24 and the epitaxial layer 22 between the adjacent source regions 24. A gate polysilicon region 27 is formed on the surface (upper surface as viewed in FIG. 3) of the gate oxidization film 26.

A P-type semiconductor region 28 for configuring the temperature detection diode group 13 and the protection diode group 14 is formed in the surface of the epitaxial layer 22. An insulation film 29 covers the surface of the semiconductor region 28. A conductive layer 20 including a plurality of N-type polysilicon regions 30 and a plurality of P-type polysilicon regions 31 are formed on the insulation film 29. More specifically, the N-type polysilicon regions 30 and the P-type polysilicon regions 31 are formed on the insulation film 29 contacting one another and arranged alternately.

Among the N-type polysilicon regions 30 and the P-type polysilicon regions 31, the three polysilicon regions from the one closest to the MOSFET 12, namely, an N-type polysilicon region 30, a P-type polysilicon region 31, and an N-type polysilicon region 30, configure the protection diode group 14. That is, the protection diode group 14 includes two diodes 14a and 14b that are connected in series in opposite directions. More specifically, the anodes of the two diodes 14a and 14b (P-type polysilicon region 31) are connected to each other in the protection diode group 14. The protection diode group 14 (i.e., the N-type polysilicon region 30) is connected to the source S of the MOSFET 12 by a wire 32.

From the N-type polysilicon region 30 that is the third one from the left side as viewed in FIG. 3, an even number (only two shown in FIG. 3) of the P-type polysilicon regions 31 and N-type polysilicon regions 30 are orderly arranged in a direction separate from the protection diode group 14 to configure the temperature detection diode group 13. The same N-type polysilicon region 30 is shared by the temperature detection diode group 13 and the protection diode group 14. That is, the cathode of the temperature detection diode group 13 and the cathode of the protection diode group 14 are connected to each other.

A source electrode 50 covers the exposed surface of the channel regions 23 and the source regions 24. A drain electrode (not shown) is formed on the rear surface (lower surface as viewed in FIG. 3) of the semiconductor substrate 21.

The operation of the semiconductor device 11 will now be discussed.

In the semiconductor device 11, the gate G is connected to a controller (not shown), the source S is grounded, and the drain D is connected to a power supply (not shown). The semiconductor device 11 is used in a state in which a constant current supply (not shown) supplies the anode A of the temperature detection diode group 13 with constant current.

The MOSFET 12 controls the main current in accordance with a signal provided to the gate G. Gate voltage is applied so that the potential at the drain D becomes higher than the potential at the source S, and the potential at the gate G becomes higher than the potential at the source S. The MOSFET 12 is activated when the gate voltage exceeds a threshold voltage.

Current flows from the anode A to the cathode K in the temperature detection diode group 13 to generate forward direction voltage in the temperature detection diode group 13. The voltage value of the temperature detection diode group 13 is dependent on temperature. Thus, the current value is kept constant to detect temperature from the voltage value. Data indicating the relationship between temperature and current/voltage for the temperature detection diode group 13 is obtained beforehand through experiments.

The temperature detection diode group 13 differs from the prior art in that it does not include a protection diode connected in parallel to the temperature detection diode group 13 in the opposite direction. Accordingly, temperature detection accuracy is not lowered since leakage current does not flow through the protection diode. When electrostatic discharge is applied to the anode A of the temperature detection diode group 13, current resulting from the electrostatic discharge flows through the temperature detection diode group 13. Conversely, when electrostatic discharge is applied to the cathode K of the temperature detection diode group 13, the protection diode group 14 functions as a zener diode, and the current resulting from the electrostatic discharge flows through the protection diode group 14 to the source regions 24 of the MOSFET 12. The MOSFET 12 has an area and parasitic capacity that are greater than the temperature detection diode group 13. Thus, the MOSFET 12 absorbs the current resulting from electrostatic discharge. Accordingly, the temperature detection diode group 13 is protected from electrostatic discharge.

The semiconductor device 11 of the preferred embodiment has the advantages described below.

(1) In the semiconductor device 11, the protection diode group 14 is connected between the source S of the MOSFET 12 and the cathode K of the temperature detection diode group 13. Accordingly, the temperature detection diode group 13 does not include a protection diode that is connected in parallel in the opposite direction like in the prior art. Thus, the temperature detection accuracy of the temperature detection diode group 13 is improved in comparison to the semiconductor device of the prior art. When electrostatic discharge is applied to the cathode K of the temperature detection diode group 13, current resulting from the electrostatic discharge flows to the source S via the protection diode group 14 and is absorbed by the parasitic capacitance of the MOSFET 12. This protects the temperature detection diode group 13 from electrostatic discharge.

(2) The protection diode group 14 includes the diodes 14a and 14b, which are connected in series in opposite directions. Accordingly, except when electrostatic discharge is applied to the cathode K of the temperature detection diode group 13, current does not flow from the cathode K of the temperature detection diode group 13 to the semiconductor element (MOSFET 12) and from the semiconductor element to the cathode K. This further improves the temperature detection accuracy.

(3) The anodes of the two diodes 14a and 14b are connected to each other in the protection diode group 14. This configuration reduces one polysilicon region relative to a configuration in which the cathodes of two diodes 14a and 14b are connected to each other in a protection diode group 14.

(4) An N-channel MOSFET 12 is used as the semiconductor element, and the protection diode group 14 is connected between the source S of the MOSFET 12 and the cathode K of the temperature detection diode group 13. Thus, the N-channel MOSFET 12 has the above advantages (1) to (3).

It should be apparent to those skilled in the art that the present invention may be embodied in many other specific forms without departing from the spirit or scope of the invention. Particularly, it should be understood that the present invention may be embodied in the following forms.

The protection diode group 14 may include two diodes 14a and 14b that are connected in series in opposite directions with the cathodes of the two diodes 14a and 14b connected to each other.

The number of diodes configuring the protection diode group 14 is not limited to two. The protection diode group 14 may include a plurality of diodes connected in series in the same direction as the diode 14a or a plurality of diodes connected in series in the same direction as the diode 14b. For example, the protection diode group 14 may include a diode connected in one direction and a plurality of diodes connected in the other direction.

Figure 4A:
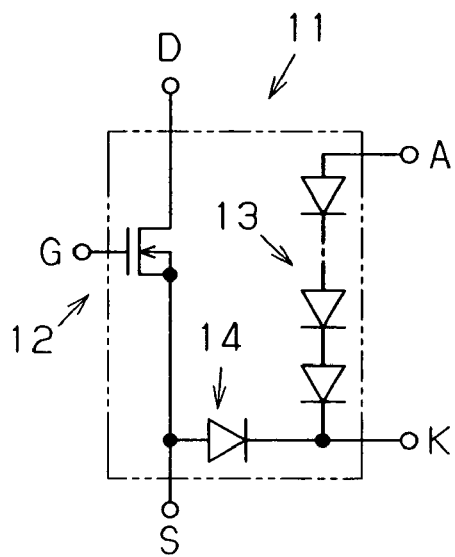
FIG. 4A is an equivalent circuit diagram of a semiconductor device according to a further embodiment of the present invention.
Figure 4B:
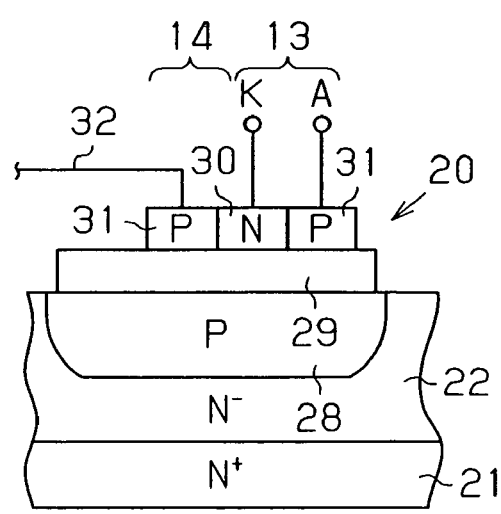
FIG. 4B is a schematic, partial cross-sectional diagram of the semiconductor device of FIG. 4A.

Referring to FIGS. 4A and 4B, the protection diode group 14 may be configured by one diode with an anode connected to the source S and a cathode connected to the cathode K of the temperature detection diode group 13. The conductive layer 20 has the N-type polysilicon region 30 that is arranged at the left end (as viewed in FIG. 4B) of the temperature detection diode group 13 and is also used as the right end (as viewed in FIG. 4B) of the protection diode group 14. The protection diode group 14 may be configured by more than one diode. In this case, when the potential at the source S becomes higher than the potential at the cathode K of the temperature detection diode group 13, current flows from the source S to the cathode K. However, the potential at the source S is normally the same as the potential at the cathode K of the temperature detection diode group 13. Accordingly, the temperature detection accuracy of the temperature detection diode group 13 in the semiconductor device 11 is higher than that of the semiconductor device in the prior art.

Figure 5A:
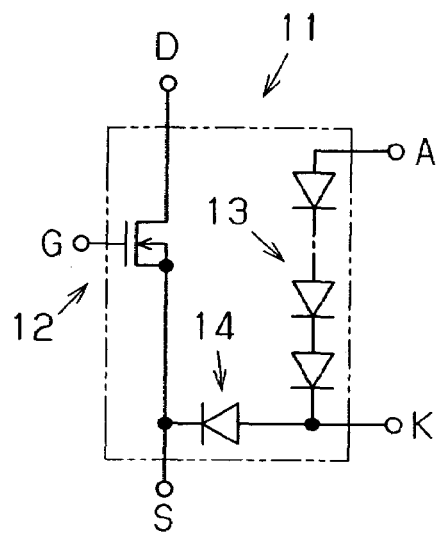
FIG. 5A is an equivalent circuit diagram of a semiconductor device according to another embodiment of the present invention.
Figure 5B:
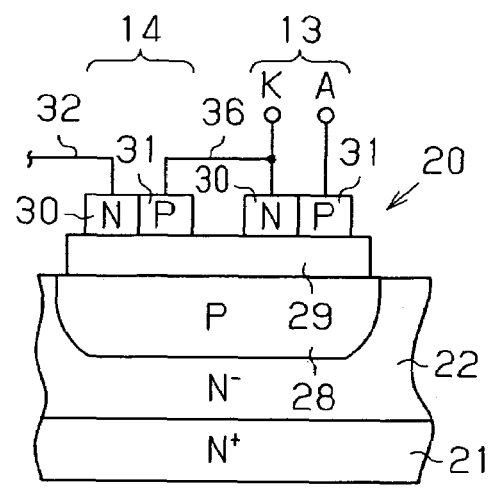
FIG. 5B is a schematic, partial cross-sectional diagram of the semiconductor device of FIG. 5A.

Referring to FIGS. 5A and 5B, the protection diode group 14 may be configured by one diode with a cathode connected to the source S and an anode connected to the cathode K of the temperature detection diode group 13. The protection diode group 14 may be configured by more than one diode. In this configuration, the protection diode group 14 and the temperature detection diode group 13 do not share the same polysilicon region. In the conductive layer 20, the P-type polysilicon region 31 configuring the anode of the protection diode group 14 is connected to the N-type polysilicon region 30 configuring the cathode K of the temperature detection diode group 13 by a wire 36. This configuration has substantially the same advantages as the semiconductor device 11 of FIGS. 4A and 4B.

Figure 6A:
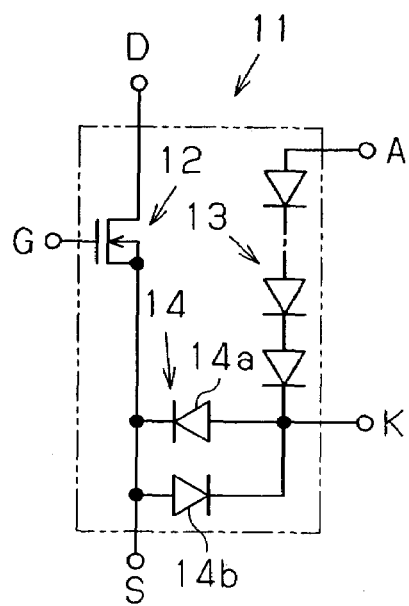
FIG. 6A is an equivalent circuit diagram of a semiconductor device according to still another embodiment of the present invention.
Figure 6B:
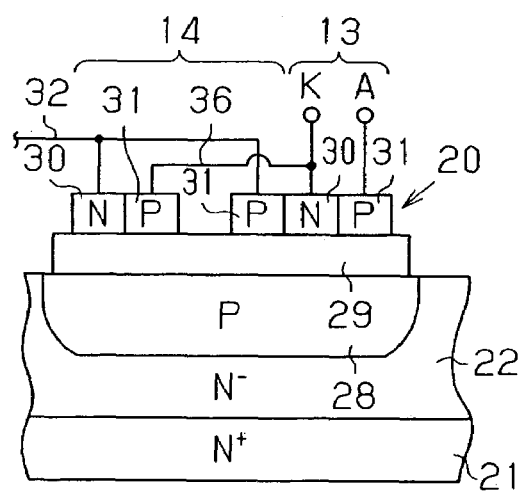
FIG. 6B is a schematic, partial cross-sectional diagram of the semiconductor device of FIG. 6A.

Referring to FIGS. 6A and 6B, in the conductive layer 20, the protection diode group 14 may include two diodes 14a and 14b that are connected in parallel in opposite directions. Further, the protection diode group 14 may include a plurality of diodes connected in the same direction as the diode 14a or a plurality of diodes connected in the same direction as the diode 14b. This configuration also has substantially the same advantages as the semiconductor device 11 of FIGS. 4A and 4B.

Figure 7:
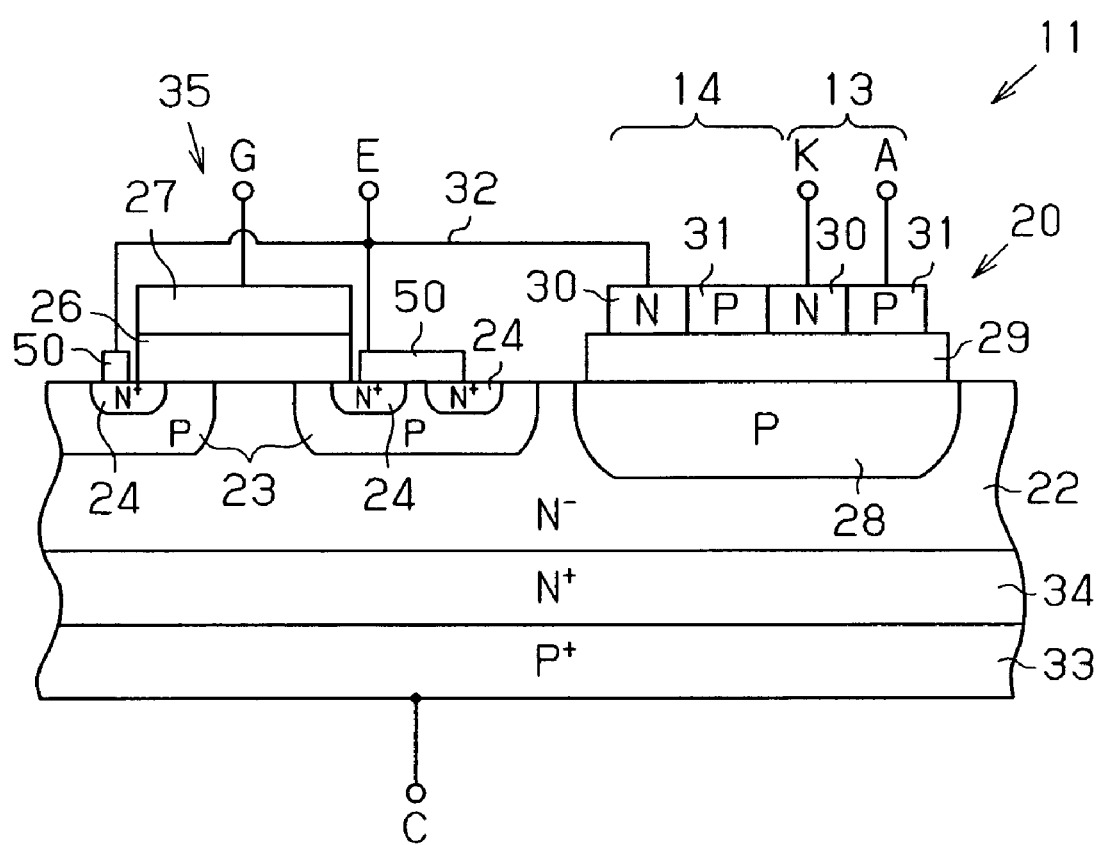
FIG. 7 is a schematic, partial cross-sectional diagram of a semiconductor device according to yet another embodiment of the present invention.

The semiconductor device to which the present invention is applied does not necessarily have to include the MOSFET 12 as the semiconductor element. For example, the present invention may be applied to a semiconductor device including an insulated gate bipolar transistor (IGBT). In this case, referring to FIG. 7, the semiconductor device is configured in the same manner as the semiconductor device 11 of the preferred embodiment that includes the MOSFET 12 except in that an $N^+$-type semiconductor layer 34 is arranged on a $P^+$-type semiconductor substrate 33. In the IGBT 35, the electrode referred to as the source in the MOSFET 12 is referred to as the emitter E, and the electrode referred to as the drain D in the MOSFET 12 is referred to as the collector C. Further, the source region is referred to as the emitter region. The semiconductor device including the IGBT 35 also substantially has advantages (1) to (3) of the preferred embodiment.

The semiconductor device including the IGBT 35 as the semiconductor element may include the protection diode group 14 shown in FIGS. 4A to 6B.

The present invention may be applied to a P-channel type semiconductor device in lieu of an N-channel type semiconductor device. In this case, the use of N-type impurities and P-type impurities is reversed. For example, for the MOSFET 12, the semiconductor substrate 21 is changed to a $P^+$-type, the epitaxial layer 22 is changed to a $P^-$type, the channel regions 23 are changed to an N-type, and the source regions 24 are changed to a $P^+$-type. Further, the protection diode group 14 is connected between the drain D of the MOSFET 12 and the cathode K of the temperature detection diode group 13.

The present invention may be applied to a semiconductor device including a MOSFET or IGBT having trench gate structure as a semiconductor element.

The present invention may be applied to a semiconductor device including a semiconductor element other than a MOSFET or an IGBT, for example, a bipolar transistor or an electrostatic induction transistor.

The present examples and embodiments are to be considered as illustrative and not restrictive, and the invention is not to be limited to the details given herein, but may be modified within the scope and equivalence of the appended claims.

What is claimed is:

1. A semiconductor device comprising:
 a semiconductor element configured to flow current between a first terminal and a second terminal in response to a switching signal inputted into a third terminal;
 a temperature detection diode having a cathode and an anode which is connected to a constant current supply, wherein the temperature detection diode detects a temperature of the semiconductor element or an ambient temperature of the semiconductor element; and
 one or more protection diodes connected between the cathode of the temperature detection diode and the second terminal of the semiconductor element in a series circuit,
 wherein the protection diode includes two diodes connected in parallel in opposite directions.

2. The semiconductor device according to claim 1, wherein the semiconductor element is an N-channel MOSFET including a source region defining the second terminal, and the one or more protection diodes are connected between the source region of the MOSFET and the cathode of the temperature detection diode.

3. The semiconductor device according to claim 1, wherein the semiconductor element is an insulated gate bipolar transistor including an emitter region defining the second terminal, and the one or more protection diodes are connected between the emitter region of the insulated gate bipolar transistor and the cathode of the temperature detection diode.

4. The semiconductor device according to claim 1, wherein the one or more protection diodes functions as a zener diode.

5. A semiconductor device comprising:
 a semiconductor element configured to flow current between a first terminal and a second terminal in response to a switching signal inputted into a third terminal;
 a temperature detection diode having a cathode and an anode which is connected to a constant current supply, wherein the temperature detection diode detects a temperature of the semiconductor element or an ambient temperature of the semiconductor element; and
 one or more protection diodes connected between the cathode of the temperature detection diode and the second terminal of the semiconductor element in a series circuit, wherein the one or more protection diodes includes two diodes connected in series in opposite directions.

6. The semiconductor device according to claim 5, wherein the anodes of the two diodes included in the one or more protection diodes are connected to each other.

7. A semiconductor device comprising:
 a first conductive region having a first conductive characteristic;
 a second conductive region having a second conductive characteristic and formed on one side of the first conductive region;
 a third conductive region having the first conductive characteristic and selectively formed on one side of the second conductive region;
 a gate layer formed adjacent to the second conductive region by way of a first insulation film;
 an electrode connected to both second and third conductive regions;
 a fourth conductive region having the second conductive characteristic and formed separately from the second conductive region on the one side of the first conductive region; and
 a conductive layer formed adjacent to the fourth conductive region by way of a second insulation film that covers the fourth conductive region, the conductive layer including;
 at least one fifth conductive region having one of the first and second conductive characteristics; and
 at least two sixth conductive region having the other one of the first and second conductive characteristics and formed adjacent to the at least one fifth conductive region, the at least one fifth conductive region and the at least two sixth conductive region defining a temperature detection diode and a protection diode, wherein the at least one fifth conductive region defines a cathode of the temperature detection diode, and the protection diode is connected between the cathode of the temperature detection diode and the electrode.

8. The semiconductor device according to claim 7, wherein the at least one fifth conductive region defines the cathode of the temperature detection diode and a cathode of the protection diode.

* * * * *